(12) United States Patent
Iwaguchi

(10) Patent No.: US 11,464,144 B2
(45) Date of Patent: Oct. 4, 2022

(54) SHIELD MEMBER

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Yuya Iwaguchi, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/425,233

(22) PCT Filed: Jan. 22, 2020

(86) PCT No.: PCT/JP2020/002078
§ 371 (c)(1),
(2) Date: Jul. 22, 2021

(87) PCT Pub. No.: WO2020/162173
PCT Pub. Date: Aug. 13, 2020

(65) Prior Publication Data
US 2022/0095497 A1 Mar. 24, 2022

(30) Foreign Application Priority Data

Feb. 7, 2019 (JP) .............................. JP2019-020315
Sep. 27, 2019 (JP) .............................. JP2019-177510

(51) Int. Cl.
*H05K 9/00* (2006.01)
*H01R 4/64* (2006.01)

(52) U.S. Cl.
CPC ........... *H05K 9/0081* (2013.01); *H01R 4/646* (2013.01); *H05K 9/0064* (2013.01); *H05K 9/0098* (2013.01)

(58) Field of Classification Search
CPC .......................... H05K 9/0098; H05K 9/0064
See application file for complete search history.

(56) References Cited

U.S. PATENT DOCUMENTS

| | | | |
|---|---|---|---|
| 10,062,477 B1 * | 8/2018 | Kagawa | ............... H05K 9/0098 |
| 2002/0195260 A1 * | 12/2002 | Marks | ................. H05K 9/0098 174/351 |

(Continued)

FOREIGN PATENT DOCUMENTS

| | | |
|---|---|---|
| JP | S58-074360 U | 5/1983 |
| JP | H08-079190 A | 3/1996 |

(Continued)

OTHER PUBLICATIONS

International Search Report dated Apr. 7, 2020 for WO 2020/162173 A1 (4 pages).

*Primary Examiner* — Hung V Ngo
(74) *Attorney, Agent, or Firm* — Venjuris, P.C.

(57) ABSTRACT

A shield member (10) disclosed herein includes a flexible conductor (12) that is electrically conductive and covers the outer surface of at least one covered wire (W); at least one ground conductor (20) that electrically connects the flexible conductor (12) to a body ground (G); an auxiliary shield conductor (30) that covers the outer surface of the ground conductor (20); and an auxiliary ground conductor (35) that electrically connects the auxiliary shield conductor (30) to the body ground (G).

4 Claims, 8 Drawing Sheets

(56) References Cited

U.S. PATENT DOCUMENTS

| | | | |
|---|---|---|---|
| 2012/0325550 A1* | 12/2012 | Hayashi | H05K 1/0228 |
| | | | 174/70 R |
| 2015/0366111 A1* | 12/2015 | Yagi | H05K 9/0098 |
| | | | 174/350 |
| 2016/0066483 A1* | 3/2016 | Fukuda | H01B 1/02 |
| | | | 174/68.3 |
| 2016/0284444 A1* | 9/2016 | Naito | H04B 3/54 |
| 2016/0295755 A1* | 10/2016 | Lee | H05K 9/0098 |
| 2017/0197563 A1* | 7/2017 | Weber | B60R 16/023 |
| 2018/0183400 A1 | 6/2018 | Mizutani | |
| 2018/0277282 A1* | 9/2018 | Mizutani | H01B 7/1875 |
| 2020/0139905 A1* | 5/2020 | Komori | B60R 16/0215 |

FOREIGN PATENT DOCUMENTS

| | | |
|---|---|---|
| JP | 2013-222645 A | 10/2013 |
| WO | 2014/148446 A1 | 9/2014 |

\* cited by examiner

SHIELD MEMBER

CROSS REFERENCE TO RELATED APPLICATIONS

This application is a national phase of PCT application No. PCT/JP2020/002078, filed on 22 Jan. 2020, which claims priority from Japanese patent application Nos. 2019-020315 and 2019-177510 filed on 7 Feb. 2019 and 27 Sep. 2019, respectively, all of which are incorporated herein by reference.

TECHNICAL FIELD

The technique disclosed in the present specification relates to a shield member.

BACKGROUND

Japanese Patent Laid-Open Publication No. 2013-222645 (Patent Document 1 below) describes a known example of an electromagnetic shield tool for attachment to an insulated wire. This electromagnetic shield tool has a conductive sheet-like sheet member and terminal fittings that are electrically connected to the sheet member and grounded to the housing of a device or the like. The sheet member is bent into a tubular shape so as to cover the outer surface of the insulated wire, and is attached to the insulated wire. The terminal fittings are provided on the outer edge portions of the two ends of the sheet member in the extending direction of the insulated wire. The sheet member is electrically connected to the housing via the terminal fittings and thus grounded to the housing.

PRIOR ART DOCUMENT

Patent Document

Patent Document 1: JP 2013-222645 A

SUMMARY OF THE INVENTION

Problems to be Solved

In the above-described electromagnetic shield tool, the portions of the sheet member that are grounded to the housing are located at the two ends in the extending direction of the insulated wire. Accordingly, if the length of the insulated wire is increased in the extending direction, the length of the sheet member also increases in the extending direction of the insulated wire. Accordingly, with the above-described electromagnetic shield tool, there is a reduction in the effect of mitigating electrical noise emitted from the insulated wire, that is to say a reduction in the wire radiation emission mitigation effect.

The present specification discloses a technique for improving the wire radiation emission mitigation effect.

Means to Solve the Problem

A shield member disclosed by the present specification includes: a shield conductor that is electrically conductive and is configured to cover an outer surface of at least one wire; at least one ground conductor configured to electrically connect the shield conductor to a ground potential; an auxiliary shield conductor configured to cover an outer surface of the ground conductor; and an auxiliary ground conductor configured to electrically connect the auxiliary conductor to the ground potential.

Effect of the Invention

According to the technique disclosed in the present specification, it is possible to improve the wire radiation emission mitigation effect.

DETAILED DESCRIPTION TO EXECUTE THE INVENTION

Overview of Present Embodiment

Figure 1:
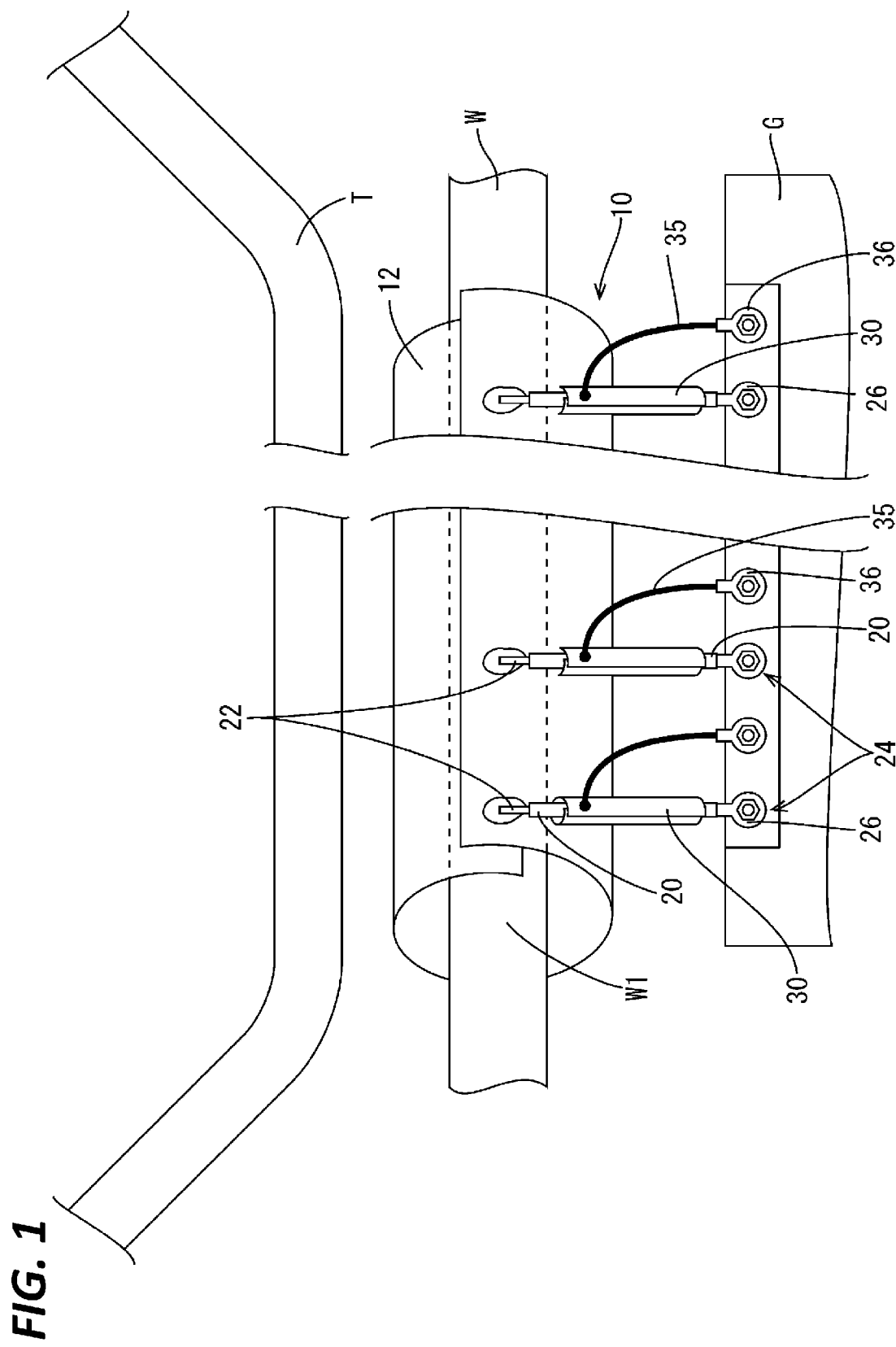
FIG. 1 is a conceptual diagram showing a state in which a shield member according to an embodiment has been attached to a wire.

First, an overview of an embodiment disclosed in the present specification will be described.

A shield member includes: a shield conductor that is electrically conductive and is configured to cover an outer surface of at least one wire; at least one ground conductor configured to electrically connect the shield conductor to a ground potential; an auxiliary shield conductor configured to cover an outer surface of the ground conductor; and an auxiliary ground conductor configured to electrically connect the auxiliary conductor to the ground potential.

The inventor of the present invention studied the effect of mitigating electrical noise generated in a wire, that is to say the wire radiation emission mitigation effect. The inventor focused on improving the wire radiation emission mitigation effect by mitigating electrical noise generated in the wire as well as electrical noise generated in the ground conductor to which electrical noise generated in the wire flows.

In other words, according to the shield member having the above configuration, electrical noise generated in the wire can flow to the ground potential through the shield conductor and the ground conductor. Also, in addition to allowing electrical noise generated in the wire to flow to the ground potential, electrical noise generated in the ground conductor can flow to the ground potential through the auxiliary shield conductor and the auxiliary ground conductor.

As a result, compared with a shield member that only has the ground conductor for example, the shield member having the above configuration can improve the effect of mitigating electrical noise emitted from the wire, that is to say the wire radiation emission mitigation effect.

A configuration is possible in which the shield conductor is formed as a flexible sheet that is electrically conductive and covers the outer surface of the at least one wire.

According to such a configuration, the shield conductor can be attached to the wire more easily than in the case where a conductor formed by bending a metal plate member or the like is arranged around the wire. Also, it is possible to reduce the amount of attachment space after attachment of the shield conductor to the wire.

A configuration is possible in which the shield conductor is attached by being wrapped around the wire that is arranged in a vicinity of an object that is susceptible to electrical noise.

According to this configuration, the conductor is attached by being wrapped around the wire arranged in the vicinity of the object, thus making it possible to mitigate electrical noise generated in the wire. In other words, by performing post-processing for attaching the shield member to the wire that requires mitigation of electrical noise, it is possible to mitigate the emission of radiation by the wire toward the object.

A configuration is possible in which a plurality of the ground conductors are connected to the shield conductor at equal intervals.

According to this configuration, the emission of radiation by the wire is efficiently mitigated.

Details of Present Embodiment

The shield member disclosed in the present specification is not intended to be limited to the examples below, but rather the scope of the present invention is indicated by the claims and includes all modifications within the meaning and scope equivalent to the claims.

Embodiment

An embodiment of the technique disclosed in the present specification will be described with reference to FIG. 1. The present embodiment illustrates an example of a shield member 10 for attachment to a covered wire (an example of a "wire") W.

The covered wire W is formed by coating a conductive core wire with an insulating coating. The covered wire W connects electronic control units (ECUs) (not shown) that are provided in a vehicle, for example.

Electrical noise from the ECUs propagates to the covered wire W. Accordingly, in the vicinity of the covered wire W, electrical noise is emitted from the covered wire W, or in other words, so-called radiation emission occurs. Also, as shown in FIG. 1, the covered wire W is arranged so as to extend in the left-right direction along a signal line T (an example of an "object"), which is susceptible to the effect of electrical noise, in the vicinity of the signal line T.

The shield member 10 includes a flexible conductor (an example of a "shield conductor") 12 that is flexible and covers the outer surface of a wire, a plurality of ground conductors 20 that are connected to the flexible conductor 12, a plurality of auxiliary shield conductors 30 that respectively cover the outer surfaces of the ground conductors 20, and a plurality of auxiliary ground conductors 35 that are respectively connected to the auxiliary shield conductors 30.

The flexible conductor 12 is formed of a flexible metal foil that is electrically conductive. The metal that constitutes the flexible conductor 12 can be appropriately selected, as necessary, from among metals that have conductivity, such as copper, a copper alloy, aluminum, and an aluminum alloy.

The flexible conductor 12 is formed as a substantially rectangular sheet having a length dimension in the left-right direction that is substantially the same as the length dimension in the left-right direction of an interference portion W1 of the covered wire W that is arranged extending along the signal line T. The flexible conductor 12 is attached by wrapping it around the interference portion W1 of the covered wire W so as to completely surround the interference portion W1. In other words, the flexible conductor 12 can be attached to the interference portion W1 of the covered wire W by post-processing.

Also, the flexible conductor 12 is attached to the covered wire W such that substantially no gap is formed between the interference portion W1 and the flexible conductor 12. Note that in FIG. 1, in order to make it easier to understand the positional relationship between the interference portion W1 and the flexible conductor 12, the interference portion W1 and the flexible conductor 12 are shown separated from each other for convenience.

In other words, compared with the case where the flexible conductor 12 is attached by bending a plate member around the interference portion for example, post-processing is easier to perform, and it is possible to reduce the amount of space required for attachment of the flexible conductor 12.

The ground conductors 20 are connected, with equal intervals therebetween, to an outer side edge portion on the long side of the flexible conductor 12 that is wrapped around the covered wire W. Each ground conductor 20 is formed by coating a conductive core wire with an insulating coating. Also, each ground conductor 20 includes a conductor connection portion 22 that is connected to the flexible conductor 12 and a ground connection portion 24 for connection to a body ground G of the vehicle.

The conductor connection portion 22 is formed by peeling away the insulating coating at one end of the ground conductor 20 to expose the core wire. The conductor connection portions 22 can be connected to the flexible conductor 12 by appropriately selecting, as necessary, a known connection method such as soldering, brazing, ultrasonic welding, laser welding, or the like.

The ground connection portion 24 is formed by connecting a terminal 26 to the core wire that has been exposed by peeling away the insulating coating at the other end of the ground conductor 20.

The terminal 26 is formed by processing an electrically conductive metal plate member. The terminal 26 is connected by being bolted to the body ground G that is electrically connected to a ground (not shown) of the vehicle. Accordingly, the ground connection portion 24 becomes the ground potential when connected to the body ground G by bolting.

The auxiliary shield conductor 30 is formed of a flexible metal foil that is electrically conductive. The metal that constitutes the auxiliary shield conductor 30 can be appropriately selected, as necessary, from metals that have conductivity, such as copper, a copper alloy, aluminum, and an aluminum alloy.

The auxiliary shield conductor 30 is formed as a substantially rectangular sheet capable of covering the outer surface of the insulating coating of the ground conductor 20. The auxiliary shield conductor 30 is attached by wrapping it around the ground conductor 20 so as to completely surround the ground conductor 20. In other words, the auxiliary shield conductor 30 can be attached to the ground conductor 20 by post-processing, similarly to the flexible conductor 12.

Also, similarly to the flexible conductor 12, the auxiliary shield conductor 30 is wrapped around the auxiliary shield conductor 30 such that no gap is formed between the auxiliary shield conductor 30 and the ground conductor 20. Note that in FIG. 1, for convenience, the ground conductor 20 and the auxiliary shield conductor 30 are shown separated from each other.

In other words, compared with the case where the auxiliary shield conductor 30 is an auxiliary shield conductor that is formed of a metal plate and arranged so as to cover the outer surface of the ground conductor for example, post-processing is easier to perform, and it is possible to reduce the amount of space required for attachment of the auxiliary shield conductor 30.

The auxiliary ground conductor 35 has a similar configuration to the ground conductor 20, and is connected to the auxiliary shield conductor 30 that is wrapped around the ground conductor 20. The auxiliary ground conductor 35 is formed by covering a conductive core wire with an insulating coating. One end portion of the auxiliary ground conductor 35 is connected to the end portion of the auxiliary shield conductor 30, which is wrapped around the ground conductor 20, that is located on the conductor connection portion 22 side.

The auxiliary ground conductor 35 can be connected to the auxiliary shield conductor 30 by appropriately selecting, as necessary, a known connection method such as soldering, brazing, ultrasonic welding, laser welding, or the like.

The other end portion of the auxiliary ground conductor 35 is connected to the body ground G that is electrically connected to the ground (not shown) of the vehicle. The connection of the auxiliary ground conductor 35 to the body ground G is made via a terminal 36 bolted to the body ground G. As a result, the auxiliary ground conductor 35 becomes the ground potential.

The following describes the operation of and effects of the shield member 10 in the above-described configuration of the present embodiment.

Conventionally, with an electromagnetic shield tool in which a sheet member that covers a covered wire is connected to the housing of a device or the like with use of terminal fittings, the terminal fittings are attached to the two ends of the sheet member in the extending direction of the covered wire.

Accordingly, if the length of the covered wire increases, the length of the sheet member also increases in the extending direction of the covered wire, and the distance between the terminal fittings provided at the two ends of the sheet member also increases. In this case, electrical noise cannot flow efficiently from the sheet member to the terminal fittings, and there is concern of a reduction in the effect of mitigating electrical noise emitted from the covered wire, that is to say a reduction in the wire radiation emission mitigation effect.

In view of this, as a result of thorough investigation in order to solve the above problems, the present inventor has found the configuration of the present embodiment.

The shield member 10 of the present embodiment includes the flexible conductor (shield conductor) 12 that is electrically conductive and covers the outer surface of at least one covered wire W, the at least one ground conductor 20 that electrically connects the flexible conductor 12 and the body ground G (ground potential), the auxiliary shield conductor 30 that covers the outer surface of the ground conductor 20, and the auxiliary ground conductor 35 that electrically connects the auxiliary shield conductor 30 to the body ground G (ground potential).

In other words, according to the present embodiment, electrical noise generated in the covered wire W can flow through the flexible conductor 12 and the ground conductor 20 to the body ground G. Also, in addition to allowing electrical noise generated in the covered wire W to flow to the body ground G, electrical noise generated in the ground conductor 20 can flow through the auxiliary shield conductor 30 and the auxiliary ground conductor 35 to the body ground G.

As a result, compared with a shield member that only has the ground conductor for example, the shield member 10 of the present embodiment makes it possible to improve the effect of mitigating electrical noise emitted from the covered wire W, that is to say the wire radiation emission mitigation effect.

Also, in the present embodiment, the flexible conductor 12 is formed as a flexible sheet that covers the outer surface of at least one covered wire W. In other words, the flexible conductor 12 of the present embodiment can be attached to the covered wire W more easily than in the case where a conductor formed by bending a metal plate member or the like is arranged around a covered wire. Also, compared with the case where a conductor formed by bending a metal plate member or the like is arranged around a covered wire for example, the flexible conductor 12 makes it possible to reduce the amount of attachment space after attachment to the covered wire W.

Also, the flexible conductor 12 of the present embodiment is attached by being wrapped around the covered wire W that is arranged in the vicinity of the signal line (object) T that is susceptible to electrical noise.

In other words, with the shield member 10 of the present embodiment, by performing post-processing for attaching the flexible conductor 12 to the covered wire W that requires mitigation of electrical noise, it is possible to mitigate the emission of radiation toward the signal line T.

The ground conductors 20 of the present embodiment are connected to the flexible conductor 12 at equal intervals.

As a result, electrical noise emitted from the covered wire W is mitigated efficiently.

Experimental Example

Next, the present embodiment will be described in more detail with reference to an experimental example.

Figure 2:
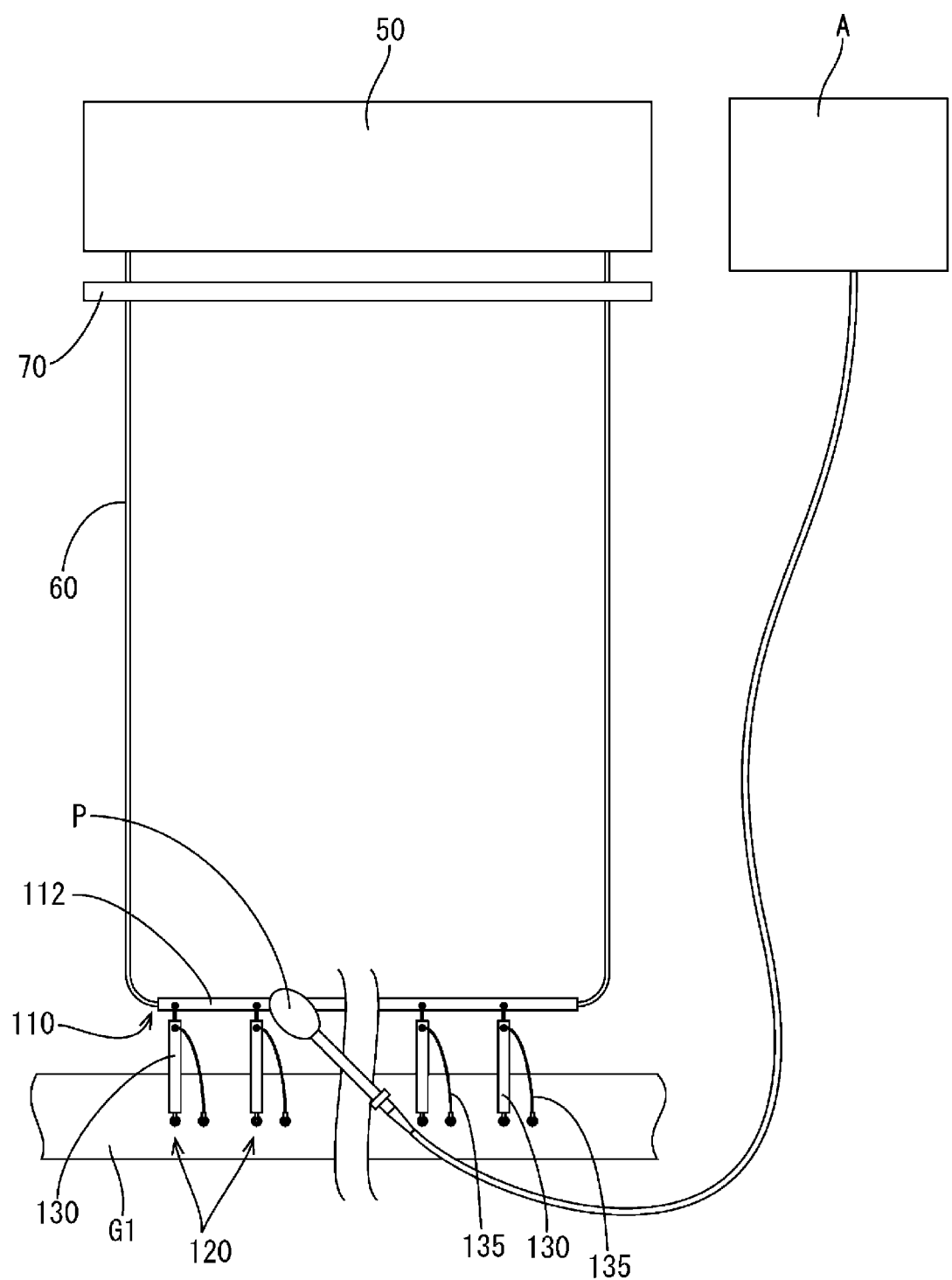
FIG. 2 is a conceptual diagram of a measuring device for measuring the emission of radiation from a wire to which the shield member is attached.
Figure 3:
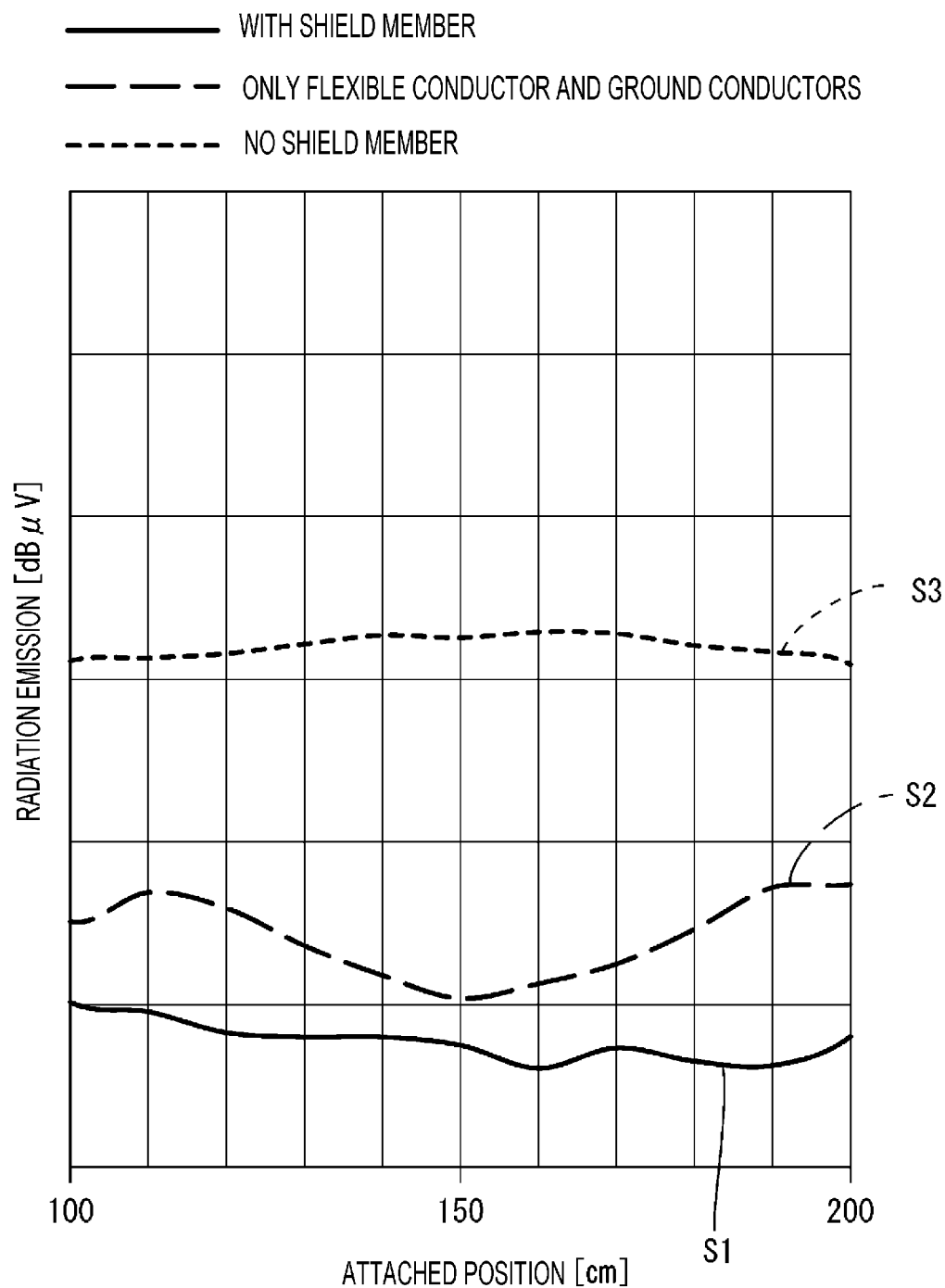
FIG. 3 is a graph showing the radiation emission mitigation effect of the shield member with respect to a pulse of 75 MHz.
Figure 4:
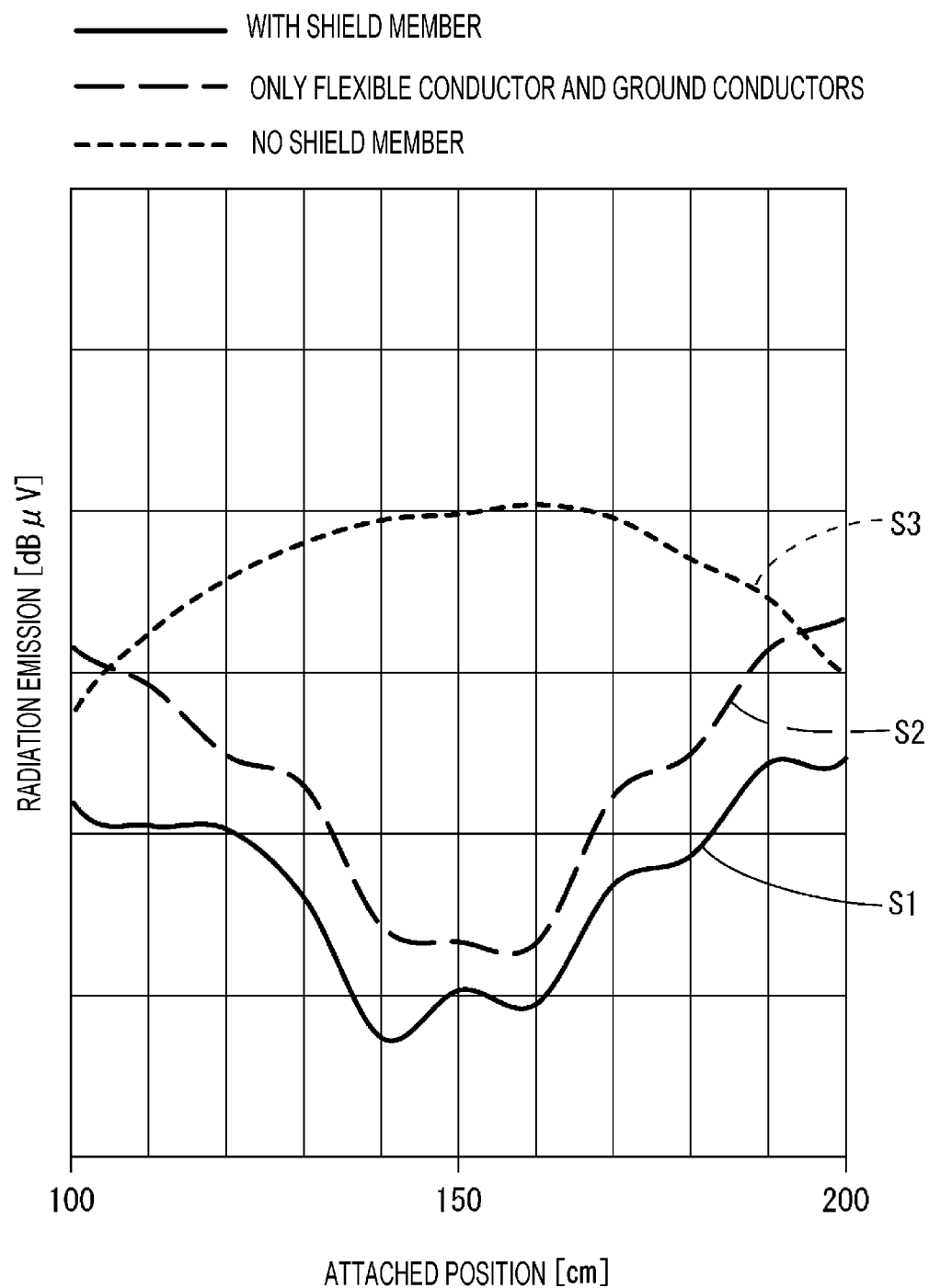
FIG. 4 is a graph showing the radiation emission mitigation effect of the shield member with respect to a pulse of 125 MHz.

In this experimental example, as shown in FIG. 2, a covered wire (an example of a "wire") 60 arranged in a loop is connected to a pulse generator 50. A shielding plate 70 is installed at the end portion of the covered wire 60 on the pulse generator 50 side in order to prevent pulses from leaking from the pulse generator 50 side to the covered wire 60 side.

A flexible conductor (an example of a "shield conductor") 112 of a shield member 110 is attached by being wrapped around a portion of the covered wire 60 that is arranged in a loop. Ground conductors 120 that are connected to a ground frame G1 are connected to the flexible conductor 112, which is attached to the covered wire 60, at equal intervals in the left-right direction. Auxiliary shield conductors 130 are wrapped around the ground conductors 120 that are connected to the flexible conductor 112. Auxiliary ground conductors 135 connected to the ground frame G1 are connected to end portions, on the flexible conductor 112 side, of the auxiliary shield conductors 130 that are attached to the ground conductors 120.

Here, the radiation emission mitigation effect of the shield member 110 was measured by using the portion around which the flexible conductor 112 is wound as a substitute for the interference portion W1 of the covered wire W.

The graphs of FIGS. 3 to 6 show radiation emission of the covered wire 60 at various frequencies of the pulse output from the pulse generator 50. The pulse frequency in the measurement of radiation emission of the covered wire 60 in the figures is 75 MHz in FIG. 3, 125 MHz in FIG. 4, 225 MHz in FIG. 5, and 275 MHz in FIG. 6. As shown in FIG. 2, the emission of radiation is measured by bringing a probe P, which is connected to a spectrum analyzer A, into contact with the flexible conductor 112 at intervals of 10 cm, and measuring the emission of radiation when the probe P is brought into contact with the flexible conductor 112. In the graphs of FIGS. 3 to 6, the X axis shows the distance [cm] of the flexible conductor 112 from the pulse generator 50, and the Y axis shows the intensity of radiation emission [dBµV].

In the graphs, the radiation emission of the covered wire 60 to which the shield member 110 is attached is denoted by S1, the radiation emission of the covered wire 60 to which only the flexible conductor 112 and the ground conductors 120 (without the auxiliary shield conductors and the auxiliary ground conductors) are attached is denoted by S2, and the radiation emission of the covered wire 60 with nothing attached is denoted by S3.

Here, upon comparing S1 to S3 in the graphs, it can be seen that the covered wire (S1) to which the shield member 110 of the present embodiment is attached has lower radiation emission than the covered wire (S2) to which only the flexible conductor 112 and the ground conductors 120 are attached and the covered wire (S3) to which nothing is attached.

In other words, according to the present embodiment, in addition to allowing electrical noise generated in the covered wire 60 to flow to the ground frame G1, electrical noise generated in the ground conductors 120 is allowed to flow to the ground frame G1, thus making it possible to improve the radiation emission mitigation effect of the covered wire 60.

Figure 5:
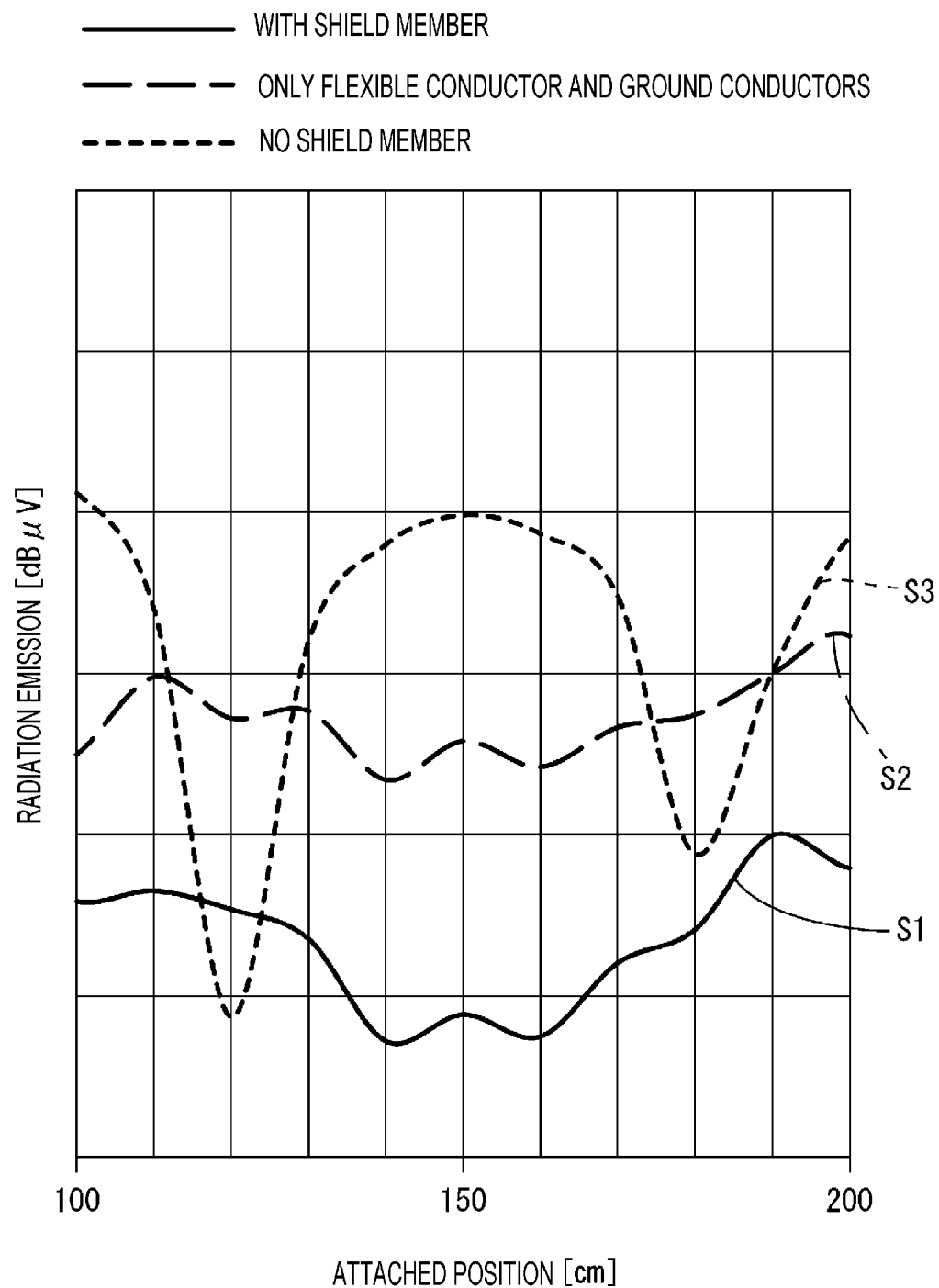
FIG. 5 is a graph showing the radiation emission mitigation effect of the shield member with respect to a pulse of 225 MHz.
Figure 6:
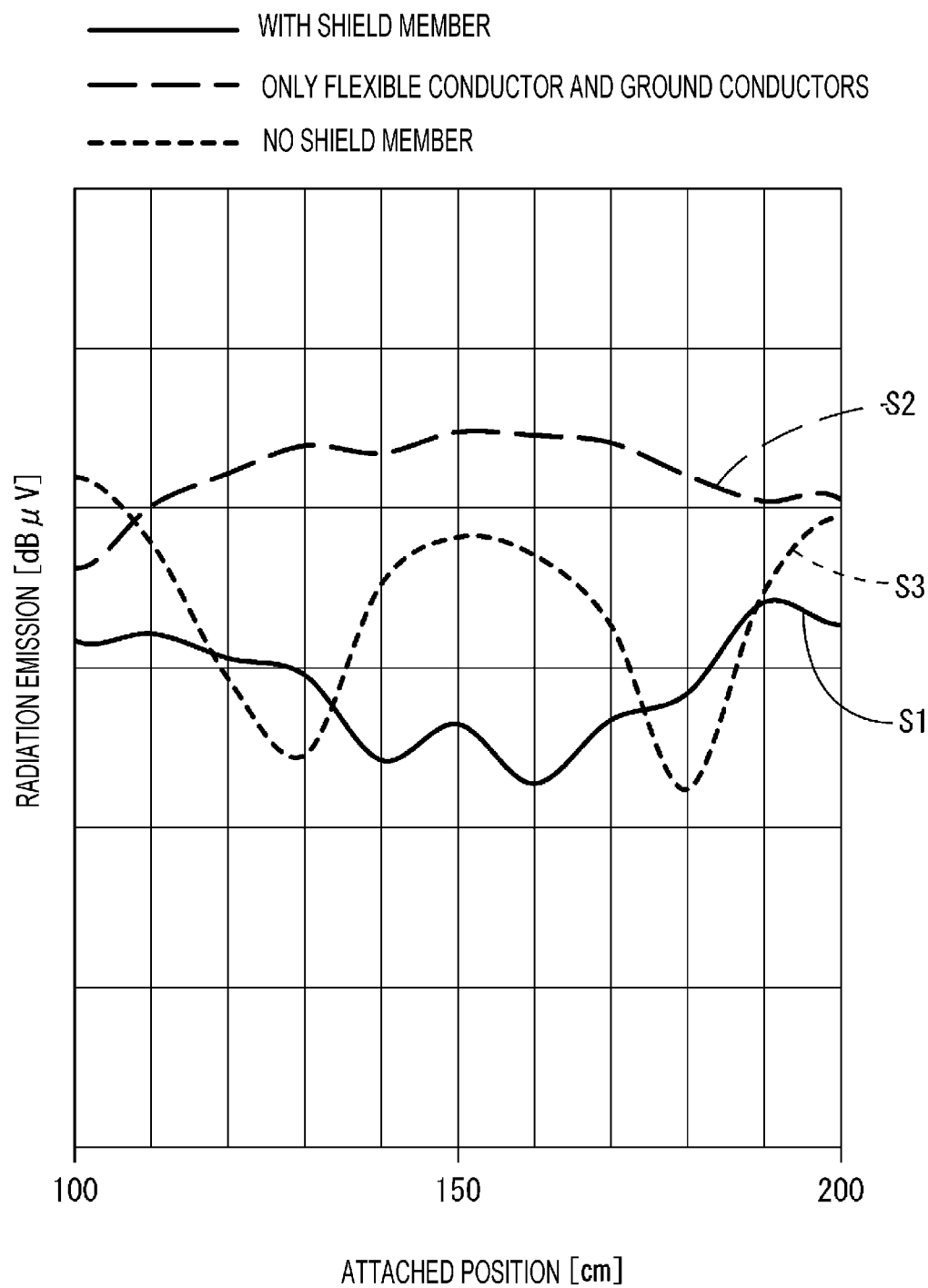
FIG. 6 is a graph showing the radiation emission mitigation effect of the shield member with respect to a pulse of 275 MHz.

When electrical noise generated in the covered wire 60 is in the vicinity of the 200 MHz band, as shown in FIGS. 5 and 6, the radiation emission mitigation effect degrades if only the flexible conductor 112 and the ground conductors 120 are connected to the covered wire 60.

However, if the shield member 110 of the present embodiment is attached, electrical noise generated in the ground conductor is allowed to flow to the ground potential, and therefore the improved radiation emission mitigation effect can be maintained even when the electrical noise is in the vicinity of the 200 MHz band as shown in FIGS. 5 and 6.

Specifically, according to the shield member 110 of the present embodiment, it is possible to improve the effect of mitigating electrical noise (radiation emission mitigation effect) in a wide frequency band at least from 75 MHz to 275 MHz. Note that in FIGS. 5 and 6, the portions where the radiation emission value of the covered wire 60 not provided with the shield member 110 is small arise due to the influence of a standing wave caused by the overlapping of an input wave node and a reflected wave node.

Figure 7:
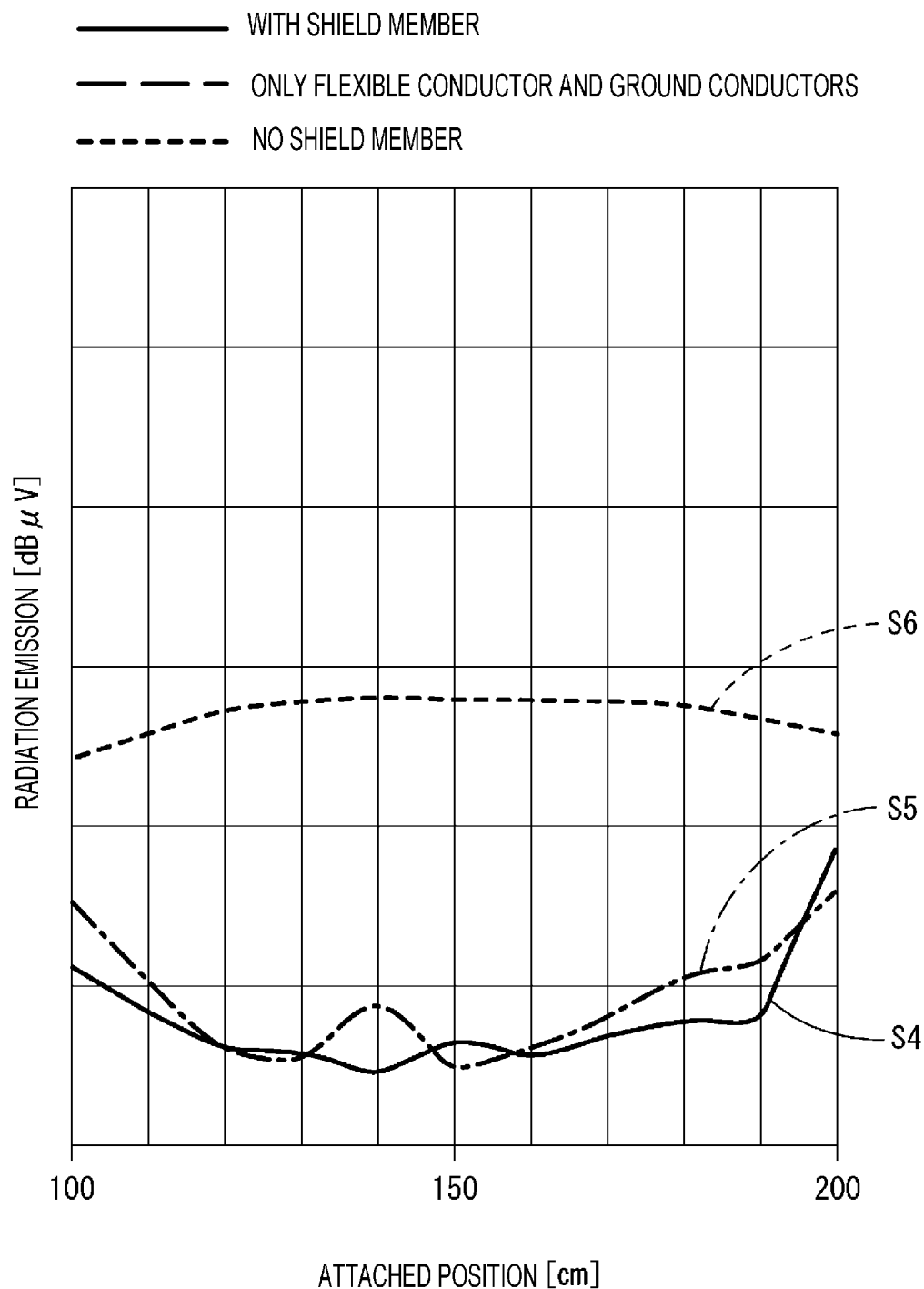
FIG. 7 is a graph showing the radiation emission mitigation effect of the shield member with respect to a pulse of 75 MHz.
Figure 8:
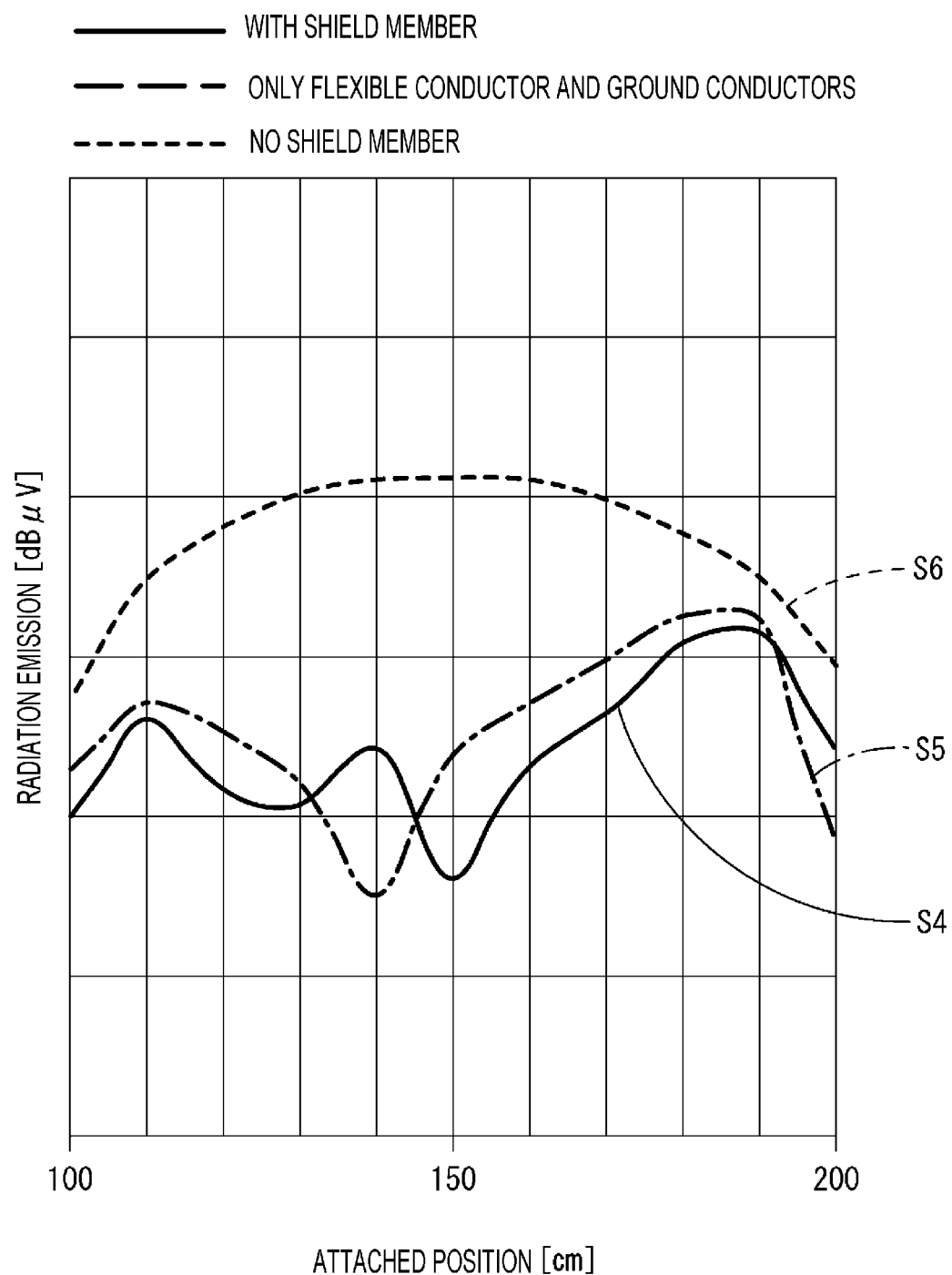
FIG. 8 is a graph showing the radiation emission mitigation effect of the shield member with respect to a pulse of 125 MHz.

The graph shown in FIG. 7 shows the radiation emission of the covered wire 60 when the pulse frequency output from the pulse generator 50 is 75 MHz, and the graph shown in FIG. 8 shows the radiation emission of the covered wire 60 when the pulse frequency is 125 MHz.

In the graphs, the radiation emission of the covered wire 60 to which the shield member 110 is attached is denoted by S4, the radiation emission of the covered wire 60 to which only the flexible conductor 112 and the ground conductors 120 (without the auxiliary shield conductors and the auxiliary ground conductors) are attached is denoted by S5, and the radiation emission of the covered wire 60 with nothing attached is denoted by S6.

In the case of the covered wire 60 to which only the flexible conductor 112 and the ground conductors 120 (without auxiliary shield conductor and auxiliary ground conductor) are attached, the ground conductors 120 are connected to the flexible conductor 112 at equal intervals of 20 cm.

In the case of the covered wire 60 to which the shield member 110 is attached, the ground conductors 120 are connected to the flexible conductor 112 at equal intervals of 50 cm.

Upon comparing S4 to S6 in the graphs, it can be seen that the covered wire (S4) to which the shield member 110 of the present embodiment is attached has lower radiation emission than the covered wire (S5) to which only the flexible conductor 112 and the ground conductors 120 are attached and the covered wire (S6) to which nothing is attached.

Furthermore, upon comparing S4 and S5, in the case where the shield member 110 is attached to the covered wire 60 (S4), even if the distance between the ground conductors 120 is 50 cm, it is possible to obtain almost the same radiation emission mitigation effect as when the covered wire 60 is provided with only the flexible conductor 112 and the ground conductors 120 that are attached at 20 cm intervals (S5). In other words, by using the shield member 110 according to the present disclosure, it is possible to efficiently obtain the radiation emission mitigation effect with a smaller number of ground conductors 120 than in the case where only the flexible conductor 112 and the ground conductors 120 are attached to the covered wire 60.

Other Embodiments

The technique disclosed in the present specification is not limited to the embodiment described above and in the drawings, and includes various aspects such as the following.

(1) In the above embodiment, the interference portion W1 of the covered wire W is arranged in the vicinity of the signal line T. However, the present invention is not limited to this, and the technique disclosed in the present specification may be applied when the interference portion of the wire is arranged in the vicinity of an electronic device, a power storage device, or the like.

(2) In the above embodiment, the flexible conductor 12 is wrapped around the interference portion W1. However, the present invention is not limited to this, and the flexible conductor may be arranged around the interference portion with a gap therebetween.

(3) In the above embodiment, the ground connection portion 24 is configured by connecting the terminal 26 to the portion of the ground conductor 20 where the core wire is exposed. However, the present invention is not limited to this, and similarly to the conductor connection portion, a configuration is possible in which the ground connection portion is formed by exposing the core wire of the ground conductor, and the ground connection portion constituted by the core wire is directly fixed to the body ground with solder or the like.

(4) In the above embodiment, the shield member 10 is attached to one covered wire W. However, the present invention is not limited to this, and the shield member may be attached to a plurality of covered wires.

(5) In the above embodiment, nothing is attached to the auxiliary ground conductor 35. However, the present invention is not limited to this, and a flexible conductor connected to the ground potential may be further attached to the auxiliary ground conductor such that electrical noise of the auxiliary ground conductor flows to the ground potential.

LIST OF REFERENCE NUMERALS

10, 110 Shield member
12, 112 Flexible conductor (example of "shield conductor")
20, 120 Ground conductor
22 Conductor connection portion
24 Ground connection portion
26 Terminal
30, 130 Auxiliary shield conductor
35, 135 Auxiliary ground conductor
36 Terminal
50 Pulse generator
70 Shielding plate
A Spectrum analyzer
G1 Ground frame
G Body ground
P Probe
T Signal line (example of "object")
W, 60 Covered wire (example of "wire")
W1 Interference portion

What is claimed is:

1. A shield member comprising:
a shield conductor that is electrically conductive and is configured to cover an outer surface of at least one wire;
at least one ground conductor configured to electrically connect the shield conductor to a ground potential;
an auxiliary shield conductor configured to cover an outer surface of the ground conductor; and
an auxiliary ground conductor configured to electrically connect the auxiliary shield conductor to the ground potential.

2. The shield member according to claim 1,
wherein the shield conductor is formed as a flexible sheet that is electrically conductive and covers the outer surface of the at least one wire.

3. The shield member according to claim 2,
wherein the shield conductor is attached by being wrapped around the wire that is arranged in a vicinity of an object that is susceptible to electrical noise.

4. The shield member according to claim 1,
wherein a plurality of the ground conductors are connected to the shield conductor at equal intervals.

* * * * *